United States Patent [19]

Brown

[11] 3,857,738

[45] Dec. 31, 1974

[54] THERMOELECTRIC BATTERY SPRING SUPPORTED IN CASING

[75] Inventor: Michael Harold Brown, Newbury, England

[73] Assignee: United Kingdom Atomic Energy Authority, London, England

[22] Filed: Nov. 16, 1972

[21] Appl. No.: 307,142

[30] Foreign Application Priority Data

Dec. 20, 1971 Great Britain .................... 59174/71

[52] U.S. Cl. .............. 136/202, 128/419 P, 136/230

[51] Int. Cl. .............................................. H01v 1/02

[58] Field of Search ............ 3/1, DIG. 2; 128/419 P; 136/202, 230, 211, 212

[56] References Cited

UNITED STATES PATENTS

| | | | |
|---|---|---|---|
| 3,472,702 | 10/1969 | Yeats et al. | 136/202 |
| 3,509,620 | 5/1970 | Phillips | 136/211 X |
| 3,510,362 | 5/1970 | Charland et al. | 136/202 |
| 3,615,869 | 10/1971 | Barker et al. | 136/202 |
| 3,626,583 | 12/1971 | Abbott et al. | 136/211 X |
| 3,649,367 | 3/1972 | Purdy | 136/202 |

OTHER PUBLICATIONS

Altieri et al., Trans. Amer. Nucl. Soc., 13, 505, (1970).

Berger et al., Inf. Bull. Isot. Generators, (France), No. 10, pp. 3–21, (1970).

*Primary Examiner*—Leland A. Sebastian
*Assistant Examiner*—E. A. Miller
*Attorney, Agent, or Firm*—Larson, Taylor and Hinds

[57] ABSTRACT

A thermoelectric battery, suitable for use with cardiac pacemakers, comprises a metal casing enclosing a thermoelectric assembly comprising a heat source, a heat sink and a P and N type thermoelectric unit attached to and extending between the heat source and the heat sink. The assembly is resiliently supported within the casing by a spring so that it can "rock" relative to the casing in order to reduce the effects of undue acceleration forces applied to the battery.

7 Claims, 1 Drawing Figure

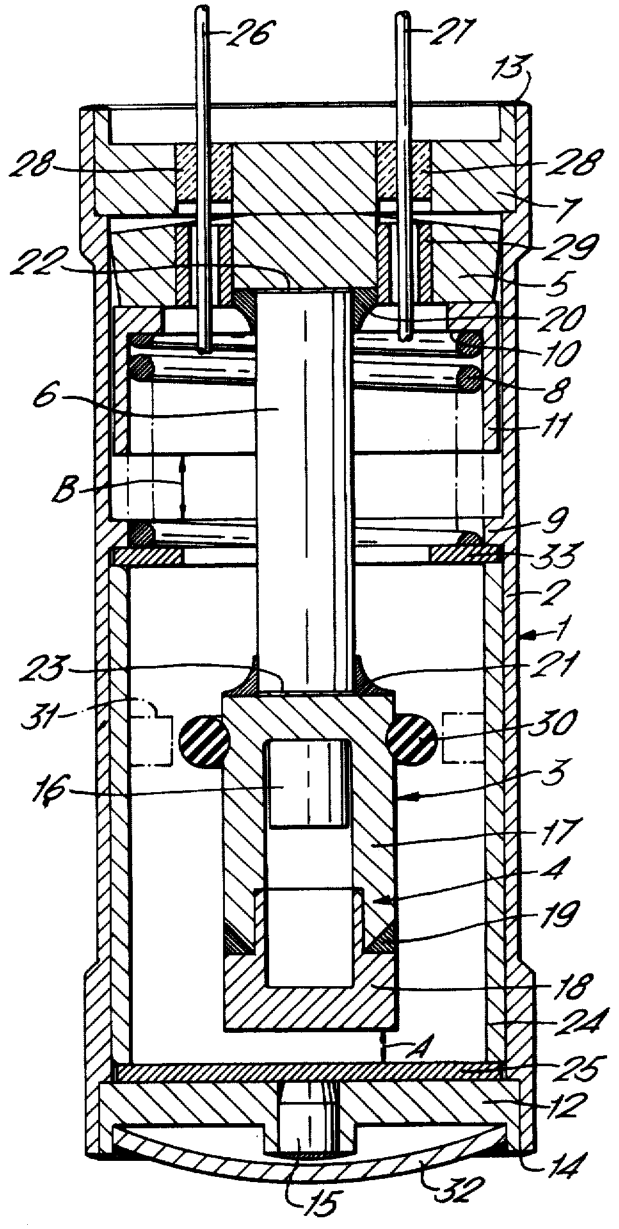
26
27
13
28
28
7
22
29
5
20
10
8
6
11
B
9
33
2
1
23
21
31
30
3
16
17
4
19
18
24
A
25
12
14
15
32

THERMOELECTRIC BATTERY SPRING SUPPORTED IN CASING

This invention relates to thermoelectric batteries, for example, thermoelectric batteries for cardiac pacemakers.

According to the invention, a thermoelectric battery comprises a casing enclosing a thermoelectric assembly comprising a heat source, a heat sink and a thermoelectric unit attached to and extending between the heat source and the heat sink, the battery also being provided with assembly mounting means for resiliently supporting the assembly within the casing, whereby the assembly can move relative to the casing in order to reduce the effects of acceleration forces and is thereafter returned to substantially its original position by a build-up in resilient force within said assembly mounting means.

Were it not for the means resiliently supporting the assembly within the casing, severe accelerations could cause overstressing of the thermoelectric unit.

An embodiment of the invention will now be described by way of example with reference to the accompanying drawing which is a side elevation in medial section.

With reference to the drawing, a thermoelectric battery 1 comprises a heat-conducting casing 2 enclosing a thermoelectric assembly 3, the assembly 3 comprising a heat source 4, a heat sink 5, and a thermopile or thermoelectric unit 6 attached to and extending between the heat source 4 and the heat sink 5.

The battery 1 is also provided with assembly mounting means for resiliently supporting the thermoelectric assembly 3 within the casing 2, whereby the assembly 3 can move relative to the casing 2 in order to reduce the effect of acceleration forces and is thereafter returned to substantially its original position by a build-up in resilient force within the said assembly mounting means.

These assembly mounting means comprise a compression spring 8 disposed between an annular radiation shield plate 33 of Tantalum abutting an internal flange 9 of the casing 2, and an internal flange 10 at the upper end of a sleeve-like spring retainer 11, the upper face of the flange 10 abutting the underside of the heat sink 5. The upper face of the heat sink 5 is made slightly frusto-conical. Thus movement of the thermoelectric assembly 3 due to laterally-applied acceleration forces is constrained to a "rocking" movement of the frusto-conical face of the heat sink 5 about the lower face of an end cap 7 fixed to the casing 2. This "rocking" movement of the assembly 3 takes place whilst its upper end part is held in heat-conducting contact with the lower, flat surface of the end cap 7 by the spring 8.

In further detail, the battery casing 2 is of stainless steel and is of tubular form. One end of the casing 2 is closed by the end cap 7 and the other end thereof by an end cap 12. The end caps 7, 12, are of stainless steel and are sealed to the casing 2 by argon-arc welds 13, 14. The end cap 12 incorporates a plug 15.

The casing 2 is filled with an inert gas (Xenon) and the final seal of the casing is made by welding the plug 15 in position.

The spring 8 is pre-loaded and does not allow movement of the assembly 3 until the load applied to the spring corresponds to about 0.6 of the load required to overstress the unit 6.

The heat sink 5 comprises an aluminium alloy disc and the heat source 4 a small cylindrical can 16 of Plutonium 238 enclosed in a housing 17 of Hastelloy C. The housing 17 incorporates an end plug 18 sealed to the housing by welding 19.

The thermoelectric unit 6 is of the form disclosed in British Pat. No. 1,303,834 to which reference should be made. Briefly, the unit 6 comprises a plurality of semi-conductor elements alternately of P- and N-type connected together to form a series of thermocouples by electrically conductive bridges. The unit 6 is attached to the heat sink 5 and heat source 4 by bonding 20, 21 and small pieces 22, 23 of insulating cloth are disposed between the unit 6 and adjacent parts of heat sink 5 and heat source 4.

The sides of the battery casing 2 adjacent the heat source 4 are lined with radiation shielding 24 of Tantalum. A shielding disc 25 of the same material is disposed across the internal face of the end cap 12. Another shielding disc 32 of Tantalum is disposed across the external end face of the end cap 12. Electrical leads 26, 27 connected to the thermoelectric unit 6 extend through holes in the end cap 7 and heat sink 5. The leads 26, 27 are insulated from and sealed to the end cap 7 by glass seals 28 and are insulated from the heat sink 5 by alumina sleeves 29. A substantial degree of side clearance exists between the sleeves 29 and leads 26, 27 so as to allow the heat sink 5 to "rock" without being restricted by the leads.

It will be noted that distance "A" between the bottom of the heat source 4 and the upper face of the shielding disc 25 is less than distance "B" between the lower end of the spring retainer 11 and the upper face of the flange 9.

In operation, assuming the battery 1 to be fitted into the body of a man, should the man bump against a wall for example, the acceleration force applied to the battery is considerable. If the acceleration force is a lateral one and is severe enough to cause a load to be applied to the spring 8 in excess of 0.6 of the load required to overstress the unit 6, the spring 8 will "give" and allow the assembly 3 to "rock" about the end cap 7 and thereby avoid overstressing of the unit 6.

Movement of the thermoelectric assembly 3 relative to the casing 2 causes a build-up in resilient force within the spring 8. When the acceleration force which caused this movement of the assembly 3 has subsided, the build-up in resilient force serves to return the assembly 3 to substantially its original position.

Return of the assembly 3 is assisted by the presence of the flat central portion of the upper face of the heat sink 5, which portion tends to "centre" the assembly 3 as it returns, and thus prevents over-run of the assembly. As the flat surfaces of the heat sink 5 and end cap 7 come together they absorb the recoil energy of the spring 8.

If the assembly 3 were not allowed to "give" under the acceleration force applied to the battery 1, the unit 6 and heat source 4 attached to the lower end thereof would behave as a loaded cantilever and it is this behaviour which would otherwise cause overstressing of the unit 6.

Should the battery 1 be subjected to a severe acceleration force acting in a longitudinal direction, the thermoelectric assembly 3 can move relative to the casing 2 by axial compression of the spring 8. As a safeguard, because distance A is less than distance B, excess longitudinal movement of the assembly 3 is limited by contact between the heat source 3 and disc 25 so as not to result in damage to the thermoelectric assembly 3 caused by undue tensile stresses being applied to the thermoelectric unit 6. Compressive stressing of the unit 6 is preferable to tensile stressing thereof. Accordingly, a very severe acceleration force acting in a longitudinal direction will cause the heat source 4 to contact the shielding disc 25 whereby although a compressive stress will then be applied to the thermoelectric unit 6, damaging tensile stresses will be avoided. Thus the disc 25 comprises stop means limiting movement of the assembly 3 relative to the casing 2.

As in the case of a laterally-applied acceleration force, a longitudinally-applied acceleration force causes a build-up in resilient force within the spring 8. Thus, when the acceleration force which caused this movement has subsided, the build-up in resilient force serves to return the assembly 3 to substantially its original position.

As an added protection of the thermoelectric assembly 3, against laterally applied acceleration forces, stop means comprising a rubber buffer ring 30 may be disposed between the assembly 3 and casing 2 so as to prevent direct contact between the assembly and the casing. As shown, the rubber ring 30 is fitted to the heat source 4. Alternatively, a similar ring 31 may be attached to the inner surface of the casing 2, adjacent the heat source 4.

Excess lateral movement of the assembly 3 normally results in contact between the heat source 4 and the casing 2. When this contact occurs, the unit 6 behaves like a simply-supported beam which can result in overstressing of the unit. To avoid such overstressing the rubber ring 30 (or ring 31) is used to provide a resilient buffer between the heat source 4 and the casing.

The rubber ring 30 (or ring 31) should be positioned to result in the least possible stressing of the unit 6. Its precise position therefore depends on the design and construction of the unit 6.

I claim:

1. A thermoelectric battery comprising a casing enclosing a thermoelectric assembly of elongated form comprising a heat source, a heat sink, and a thermoelectric unit attached to and disposed between the heat source and the heat sink, with at least the heat source end of the assembly defining an annular space with the casing, a heat-conducting mass of solid material disposed at the heat sink end of the assembly and attached to the casing, spring means mounted within the casing so as to bias the heat sink into heat-conducting contact with said mass, adjacent surfaces of the heat sink and the mass being formed so as to allow the assembly to move relative to the casing with a rocking motion against the bias of the spring means in the event of lateral acceleration forces being applied to the battery so that such motion will cause the heat source end of the assembly to pivot within the annular space, and resilient stop means for preventing direct contact between said assembly and said casing.

2. A battery as claimed in claim 1, wherein the adjacent surfaces of the heat sink and mass are, respectively, frustoconical and flat.

3. A battery as claimed in claim 1, wherein stop means are provided for limiting lengthwise movement of the thermoelectric assembly against the bias of the spring means.

4. A battery as claimed in claim 1, wherein the spring means comprise a compression spring encircling the thermoelectric unit.

5. A battery as claimed in claim 1, wherein said casing is of tubular form and said mass is disposed in one end of the casing so as to seal said end.

6. A battery as claimed in claim 1 further comprising electrical leads which extend from said thermoelectric unit through said mass and said heat sink to outside the battery.

7. A battery as claimed in claim 1, wherein said resilient stop means comprise buffer means attached to the heat source end of the assembly.

* * * * *